United States Patent
Sevic

[11] Patent Number: 5,535,438
[45] Date of Patent: Jul. 9, 1996

[54] PHASE LINEAR CLASS E AMPLIFIER FOR A SATELLITE COMMUNICATION TERMINAL WHICH COMMUNICATES WITH A LOW EARTH ORBITING SATELLITE

[75] Inventor: John F. Sevic, Scottsdale, Ariz.

[73] Assignee: Panasonic Technologies, Inc., Princeton, N.J.

[21] Appl. No.: 240,912

[22] Filed: May 10, 1994

[51] Int. Cl.⁶ ............................. H04B 1/04; H03F 21/00
[52] U.S. Cl. ..................... 455/110; 455/12.1; 455/115; 330/207 A; 330/251; 375/297
[58] Field of Search .......................... 455/110, 95, 115, 455/116, 120, 12.1; 375/60, 67, 297; 330/207 A, 251

[56] References Cited

U.S. PATENT DOCUMENTS

| | | | |
|---|---|---|---|
| 3,239,772 | 3/1966 | Dennis, Jr. | 330/18 |
| 3,845,403 | 10/1974 | Heckman, Jr. | 330/31 |
| 3,919,656 | 11/1975 | Sokal et al. | 330/51 |
| 4,001,711 | 1/1977 | Knutson et al. | 330/66 |
| 4,107,621 | 8/1978 | Furutani et al. | 330/296 |
| 4,468,626 | 8/1984 | Swanson | 330/10 |
| 4,607,323 | 8/1986 | Sokal et al. | 363/97 |
| 4,717,884 | 1/1988 | Mitzlaff | 330/251 |
| 4,733,194 | 3/1988 | Roehrs et al. | 330/251 |
| 4,737,968 | 4/1988 | Norton et al. | 375/60 |
| 4,754,233 | 6/1988 | Pickett | 330/311 |
| 4,757,277 | 7/1988 | Nakase et al. | 330/306 |
| 4,772,856 | 9/1988 | Nojima et al. | 330/251 |
| 4,819,272 | 4/1989 | Shimo et al. | 455/127 |
| 4,875,019 | 10/1989 | Monson et al. | 330/302 |
| 4,975,658 | 12/1990 | Takayama | 330/294 |
| 5,019,788 | 5/1991 | Fischer et al. | 330/9 |
| 5,023,566 | 6/1991 | El-Hamamsy et al. | 330/251 |
| 5,051,706 | 9/1991 | Zushi | 330/277 |
| 5,066,957 | 11/1991 | Mizuno et al. | 342/352 |
| 5,095,285 | 3/1992 | Khatibzadeh | 330/306 |
| 5,105,167 | 4/1992 | Peczalski | 330/295 |
| 5,146,178 | 9/1992 | Nojima et al. | 330/251 |
| 5,187,580 | 2/1993 | Porter, Jr. et al. | 330/207 A |
| 5,194,826 | 3/1993 | Huusko | 330/302 |
| 5,229,732 | 7/1993 | Furutani et al. | 330/277 |
| 5,241,284 | 8/1993 | Nyqvist et al. | 330/297 |
| 5,247,264 | 9/1993 | Cripe | 330/251 |
| 5,247,542 | 9/1993 | Onodera et al. | 375/60 |

FOREIGN PATENT DOCUMENTS

| | | | |
|---|---|---|---|
| 0459447 | 12/1991 | European Pat. Off. | 455/115 |
| 2689337 | 10/1993 | France . | |

OTHER PUBLICATIONS

PCT Search Report, PCT/US95/05873, Sep. 14, 1995.
Alexovich et al., "Bandpass–Limited Symmetric DPSK: A Bandwidth–Efficient Modulation for Nonlinear Channels", Milcom '92 Conference Record, San Diego, CA, vol. 3, No. 11, Oct. 1992, pp. 827–831.

(List continued on next page.)

*Primary Examiner*—Edward F. Urban
*Assistant Examiner*—Lee Nguyen
*Attorney, Agent, or Firm*—Bell, Seltzer, Park & Gibson

[57] ABSTRACT

A low earth orbiting satellite communication terminal includes a data signal generator, a modulator, and a class E switching amplifier. The modulator converts a data signal from the data signal generator into a phase modulated signal which is then amplified by the class E switching amplifier for transmission to a low earth orbiting satellite. In a preferred embodiment, the modulator converts the data signal into a symmetric differential phase shift keyed data signal. The class E switching amplifier amplifies the phase modulated signal at frequencies between about 148 and 150 MHz. The class E switching amplifier includes a switching transistor, an input matching network, a class E load network, and an output matching network. The class E load network is electrically connected to the switching transistor and loads the transistor for phase linear class E operation over a predetermined bandwidth. The class E switching amplifier may include a transistor which is designed to operate at a first predetermined frequency and at a first predetermined voltage, but which is preferably operated below these predetermined levels.

14 Claims, 4 Drawing Sheets

OTHER PUBLICATIONS

Kazimierczuk et al., "*Class E Tuned Power Amplifier with Antiparallel Diode or Series Diode at Switch, with Any Loaded W and Switch Duty Cycle*", IEEE Transactions on Circuits and Systems, vol. 36, No. 9, Sep. 1989, pp. 1201–1209.

"*The RF Line NPN Silicon RF Power Transistors*", Motorola Semiconductor Technical Data, pp. 2–883 to 2–886.

Sokal, Nathan O. and Sokal, Alan D., "*Class E Switching–Mode RF Power Amplifiers–Low Power Dissipation, Low Sensitivity to Component Tolerances (Including Transistors), and Well–Defined Operation*", 1979 IEEE Electro Conference, Apr. 25, 1979, pp. 1–9.

Everard, J. K. A. and King, A. J., "*Broadband power efficient Class E amplifiers with a non–linear CAD model of the active MOS device*", Journal of the Institution of Electronic and Radio Engineers, vol. 67, No. 2, pp. 52–58, Mar./Apr. 1987.

Zulinski, Robert E. and Steadman, John W., "*Class E Power Amplifiers and Frequency Multipliers with Finite DC–Feed Inductance*", IEEE Transactions on Circuits and Systems, vol. CAS–34, No. 9, Sep. 1987.

Sokal, Nathan O. and Redl, Richard, "*Power Transistor Output Port Model For analyzing A Switching–Mode RF Power Amplifier or Resonant Power Converter*", RF Design, Jun. 1987, pp. 45–53.

Wood, Alan, "*UHF High Efficiency Amplifier*", Motorola Inc., Semiconductor Products Sector, RF Land Mobile Engineering, Jun. 28, 1989, pp. 1–14.

McGuffin, Bruce F. and Clarke, Kenneth C., "*Waveforms For Medium/High Rate EHF Satellite Communications*", AIAA 14th International Communications Systems Conference, Mar. 22–26, 1992, pp. 1–11.

Sokal, Nathan O. and Sokal, Alan D., "*Class E–A New Class of High–Efficiency Tuned Single–Ended Switching Power Amplifiers*", IEEE Journal of Solid–State Circuits, vol. SC–10, No. 3, Jun. 1975, pp. 168–176.

Sokal, Nathan O. and Sokal, Alan D., "*Class E Switching–Mode RF Power Amplifiers*", RF Design, Summer 1980, pp. 33–39.

"ORBCOMM$^{SM}$ *Vital Communications Absolutely Anyplace on Earth$^{SM}$*", pp. 1–9.

Pawula, R. F., "*Offset DPSK and a Comparison of Conventional and Symmetric DPSK with Noise Correlation and Power Imbalance*", IEEE Transactions on Communications, vol. COM–32, No. 3, Mar. 1984.

Oetting, John D., "*A Comparison of Modulation Techniques for Digital Radio*", IEEE Transaction on Communications, vol. COM–27, No. 12, Dec. 1979.

Korn, Israel, "*Offset DPSK with Differential Phase Detector in Satellite Mobile Channel with Narrow–Bank Receiver Filter*", IEEE Transaction on Vehicular Technology, vol. 38, No. 4, Nov. 1989.

Winters, Jack H., "*Differential Detection with Intersymbol Interference and Frequency Uncertainty*", IEEE Transactions on Communications, vol. COM–32, No. 1, Jan. 1954.

Torrey Science & Technology Corporation, "*Subscriber Uplink Modulation*", Engineering Report 1, Baseline Subscriber Uplink Modulation Performance, revised Jan. 10, 1992.

Torrey Science & Technology Corporation, "*Subscriber RF Communications*", Engineering Report 9, Mar. 30, 1992.

PHASE LINEAR CLASS E AMPLIFIER FOR A SATELLITE COMMUNICATION TERMINAL WHICH COMMUNICATES WITH A LOW EARTH ORBITING SATELLITE

FIELD OF THE INVENTION

This invention relates to satellite communication systems and more particularly to terminals which communicate with satellites.

BACKGROUND OF THE INVENTION

Satellite communication systems are widely used in both military and civilian applications. Most civilian communication satellites are in geostationary orbit 22,300 miles above the earth. They receive signals from a first earth station, such as a portable terminal, and then amplify and translate the signal in frequency prior to retransmitting the signal to a second earth station. This process makes effective use of line of sight microwave bands without requiring relay towers.

The most common microwave bands used by civilian communication satellites are the carrier bands of 5,925 MHz to 6,425 MHz in the uplinks and 3,700 MHz to 4,200 MHz in the downlinks. Using microwave bands in an uplink, however, requires more complicated circuitry because of the high frequencies involved. In addition, because geostationary satellites are stationed in a high orbit with respect to other satellites, a high power output from a transmitting terminal is required. Thus, a portable terminal's size, circuitry, and cost may be elevated when operating in microwave bands, rather than when operating in lower frequencies.

Figure 1:
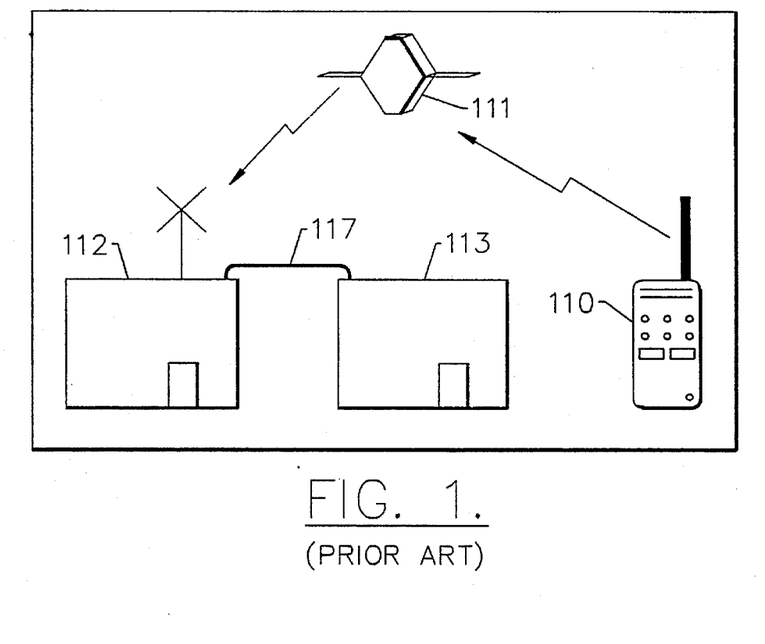
FIG. 1 is a schematic illustration of the prior art ORBCOMM communications network.

An alternative satellite communication system, known as ORBCOMM, has been proposed by the Orbital Communications Corporation of Fairfax, Virginia. The ORBCOMM system is described in a brochure published by the Orbital Communications Corporation entitled *"ORBCOMM$^{SM}$, Vital Communications Absolutely Anyplace on Earth$^{SM}$"* (1992). The ORBCOMM system is designed to bring data communications and position determination to a multitude of mobile portable terminals. The ORBCOMM network provides low speed VHF digital data communications using low earth orbiting satellites that have a very high availability. As shown in FIG. 1, the basic ORBCOMM system uses a network of satellites 111, a network control station 112, and a base station 113 to communicate with portable terminals 110. The portable terminals 110 can be pocket sized with a user input and display, and can operate for long periods on battery power. A typical message of around 100 bytes or characters is transmitted from a portable terminal 110 through the satellite 111 and to the network control center 112. The data can then be stored at the network control center 112 and accessed at a customer's convenience, similar to electronic mail. A customer at a base station 113, which could be a portable computer with a MODEM, can then poll the network control center 112 for messages via a standard phone line 117.

One element of the portable terminal 110 is an amplifier stage. The output of an amplifier in an amplifier stage is usually classified into a commonly recognized class depending on the conduction characteristics of that amplifier's active devices. One of the most common classes of amplifier is the class C amplifier. Conventional low voltage high power (i.e. class C) amplifiers, however, typically have poor power added efficiency. This is true, in part, because of conduction losses from the relatively large currents required to develop sufficient RF output power from a low voltage supply (e.g. 7 V). Another problem associated with class C amplifiers is that they tend to be phase non-linear. In other words, amplitude variation of the output signal induces a phase change in the output signal, for example, when a class C amplifier is hard limited. Because class C amplifiers tend to be hard limited, and thus phase non-linear, class C amplifiers tend to cause spectral regrowth, or intermodulation, problems. Spectral regrowth occurs when side frequency lobes of phase modulated signals experience phase nonlinearity conditions and then mix with themselves, which can potentially cause co-channel interference. Thus, spectral regrowth may hinder reception in phase modulated systems. Class C amplifiers are also more sensitive to device parameters. For example, transistors may not be easily substituted, even though their data sheet characteristics are similar. This sensitivity can make coupling class C amplifiers in stages more complicated. These characteristics of class C amplifiers make them poor choices for portable terminals when communicating with a low earth orbiting satellite.

SUMMARY OF INVENTION

It is therefore an object of the present invention to provide an improved satellite communication system.

It is another object of the present invention to provide an improved terminal for communicating with low earth orbiting satellites.

It is yet another object of the present invention to provide a low power high efficiency amplifier for a satellite communications terminal which is also phase linear.

These and other objects according to the invention are provided by using a class E switching amplifier for a terminal which communicates with a low earth orbiting satellite. As is well known to those having skill in the art, an ideal class E switching amplifier has a voltage across the active device switch when the device is off and a current flowing through the device when it is on. In addition, current is reduced to zero prior to a voltage rise, and voltage is reduced to zero prior to a current rise, when changing states at the transition points between off and on. Thus, VI power loss is kept to a minimum, and ideally zero, by keeping voltage and current isolated to different states, with resulting increases in efficiency.

The class E amplifier is described in U.S. Pat. No. 3,919,656, entitled *High-Efficiency Tuned Switching Power Amplifier*, the entire disclosure of which is herein incorporated by reference. High efficiency amplification is achieved by using a switching amplifier which, ideally, dissipates no power in the switch. Rather, all the power is dissipated in the load. An ideal class E switching device dissipates no power because it has no voltage across it when it is on and no current flowing through it when it is off. By operating the transistor as a switch, the instantaneous power is almost zero with respect to time, thus, the average power loss is almost zero as well. The '656 patent, however, does not indicate the type of transistor or other amplifier specifics necessary for low voltage, low power, high efficiency VHF operation, but only mentions npn transistors in general. Thus, the '656 patent does not describe circuit operating characteristics for different frequency ranges. Assumptions that are valid for HF (3 MHz–30 MHz) are not applicable to the VHF band (30 MHz–300 MHz).

For more information related to class E amplifiers, see, U.S. Pat. No. 4,733,194 to Roehrs et al. entitled *Apparatus and Method for Parallelling Power Field Effect Transistors in High Frequency Amplifiers*; "Broadband Power Efficient Class E Amplifiers With A Non-Linear CAD Model Of The Active MOS Device", J. K. A. Everard and A. J. King, *Journal Of The Institution Of Electronic And Radio Engineers*, Vol. 67, No. 2, pp. 52–58 (March/April 1987); and "Class E Switching-Mode RF Power Amplifiers—Low Power Dissipation, Low Sensitivity To Component Tolerances (Including Transistors) And Well-Defined Operation", Nathan O. Sokal and Alan D. Sokal, *IEEE Electro Conference*, New York, N.Y., U.S.A. (25 Apr. 1979), Session 23.

It has been realized, according to the invention, that the high efficiency of class E amplifiers can be used in a terminal for communicating with satellites. Thus, a terminal according to the invention includes a data signal generator, a modulator, and a class E switching amplifier. The data signal generator may include an alphanumeric key pad that is responsive to user activation for accepting input of a user message and generating a data signal for transmission to a low earth orbiting satellite. The modulator converts the data signal into a phase modulated signal which is then amplified by the class E switching amplifier. In a preferred embodiment, the modulator converts the data signal into a symmetric differential phase shift keyed data signal (SDPSK). The class E switching amplifier amplifies the phase modulated signal at frequencies between about 148 and 150 MHz. An antenna is electrically connected to the output of the class E switching amplifier for transmitting the phase modulated signals to the low earth orbiting satellite. In addition, a battery power supply may be used to thereby produce a portable terminal.

According to another aspect of the invention, it has been realized that an amplifier loaded for class E operation has a phase linear transfer characteristic over predetermined frequencies. In other words, a class E amplifier is phase linear over predetermined frequencies. In particular, a class E switching amplifier according to the invention includes a switching transistor, an input matching network, a class E load network, a DC bias network, and an output matching network. The input matching network electrically connects the input signal to the switching transistor and provides proper input impedance matching to ensure that the transistor is driven between cutoff and saturation. The class E load network is electrically connected to the switching transistor and loads the transistor for phase linear class E operation over a predetermined bandwidth. The output matching network electrically connects the class E load network to the load and provides proper output impedance matching. As mentioned above, the switching transistor preferably operates at a predetermined switching frequency between about 148 and 150 MHz.

According to another aspect of the invention, it has been realized that a transistor designed for use in cellular phone bandwidths can be successfully used in a satellite terminal environment. In particular, the class E switching amplifier includes a transistor which is designed to operate at a first predetermined frequency and at a first predetermined voltage, however, the transistor is preferably operated below these designed predetermined levels. A power supply provides a second predetermined voltage which is less than the first predetermined voltage to the transistor. For example, the first predetermined voltage may be 12.5 V, and the second predetermined voltage may be between 4 to 8 V. Similarly, a class E load network loads the transistor for phase linear class E operation at a second predetermined frequency which is less than the first predetermined frequency. For example, the switching transistor may be a cellular transistor designed to operate at frequencies between 806 to 960 MHz. Thus, the first predetermined frequencies would be between 806 MHz to 960 MHz, and the load network would then load transistor operation for second predetermined frequencies of between about 148 and 150 MHz. In other words, the second predetermined frequencies are about 15% of the first predetermined frequencies. The invention results in phase linear, high efficiency operation (i.e., 80+%) with a low voltage supply (e.g., 7 V) in the VHF band. Such performance is not possible with conventional transistors designed for typical low voltage class C operation. The increase in efficiency affords extended battery life, increased reliability, lower transistor temperature, lower cost, decreased weight, and reduced size for the satellite communications terminal.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
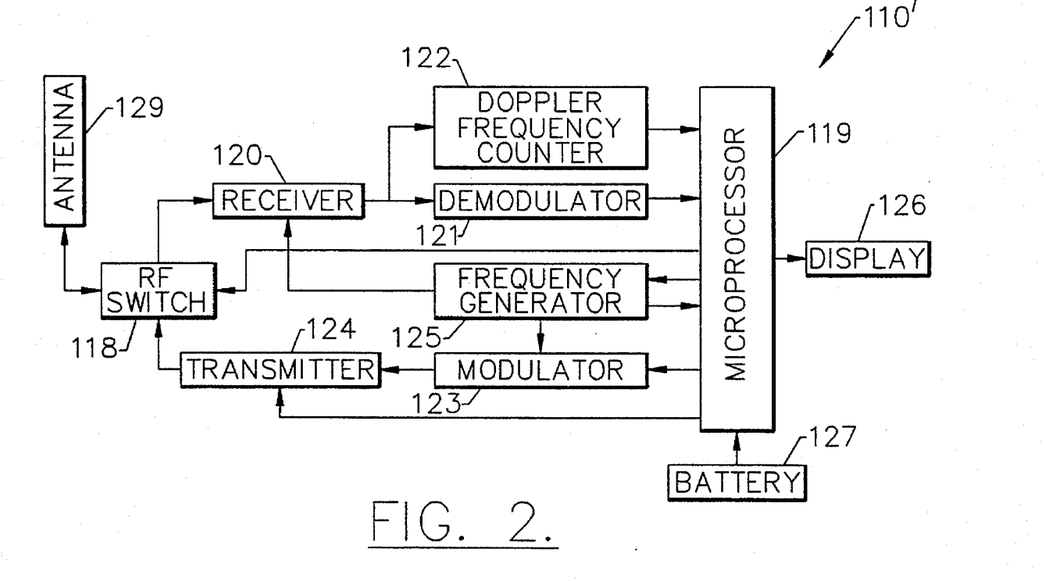
FIG. 2 is a block diagram of a terminal according to the invention which communicates with a low earth orbiting satellite of FIG. 1.

Referring now to FIG. 2, a preferred embodiment of the portable terminal 110' is shown. A microprocessor 119 controls a radio frequency (RF) switch 118 and prompts either a terminal transmit or a terminal receive mode. After a receiver 120 receives a downlink signal from the antenna 129 via the RF switch 118, it amplifies and mixes the signal to the correct power level and frequency for a demodulator 121 and a doppler frequency counter 122. A frequency generator 125 provides local oscillator frequencies to the receiver 120 which are required for mixing the received frequency to the intermediate frequency. The demodulator 121 extracts the digital data from the received signal and sends the data to the microprocessor 119. This data may contain satellite position information so that the microprocessor 119 can determine the terminal's position using a position determining algorithm and the measured doppler frequency. Alternatively, the data may be displayed as a message on a display 126, such as an LCD display. The portable terminals 110' can be pocket sized, can operate for long periods on a battery 127, and can have a simple omnidirectional whip antenna 129 fifty centimeters long.

The microprocessor 119 also controls a modulator 123 and transmitter 124. The modulator 123 uses digitally encoded information received from the microprocessor 119 to modulate the carrier frequency furnished from the frequency generator 125. The modulator 123 converts the data signal into a phase shift keyed data signal, and preferably into a symmetric differential phase shift keyed data signal. The transmitter 124 then receives a modulated signal from the modulator 123. An amplified RF signal may then be broadcast from the antenna 129 to a low earth orbiting satellite 111.

Figure 3:
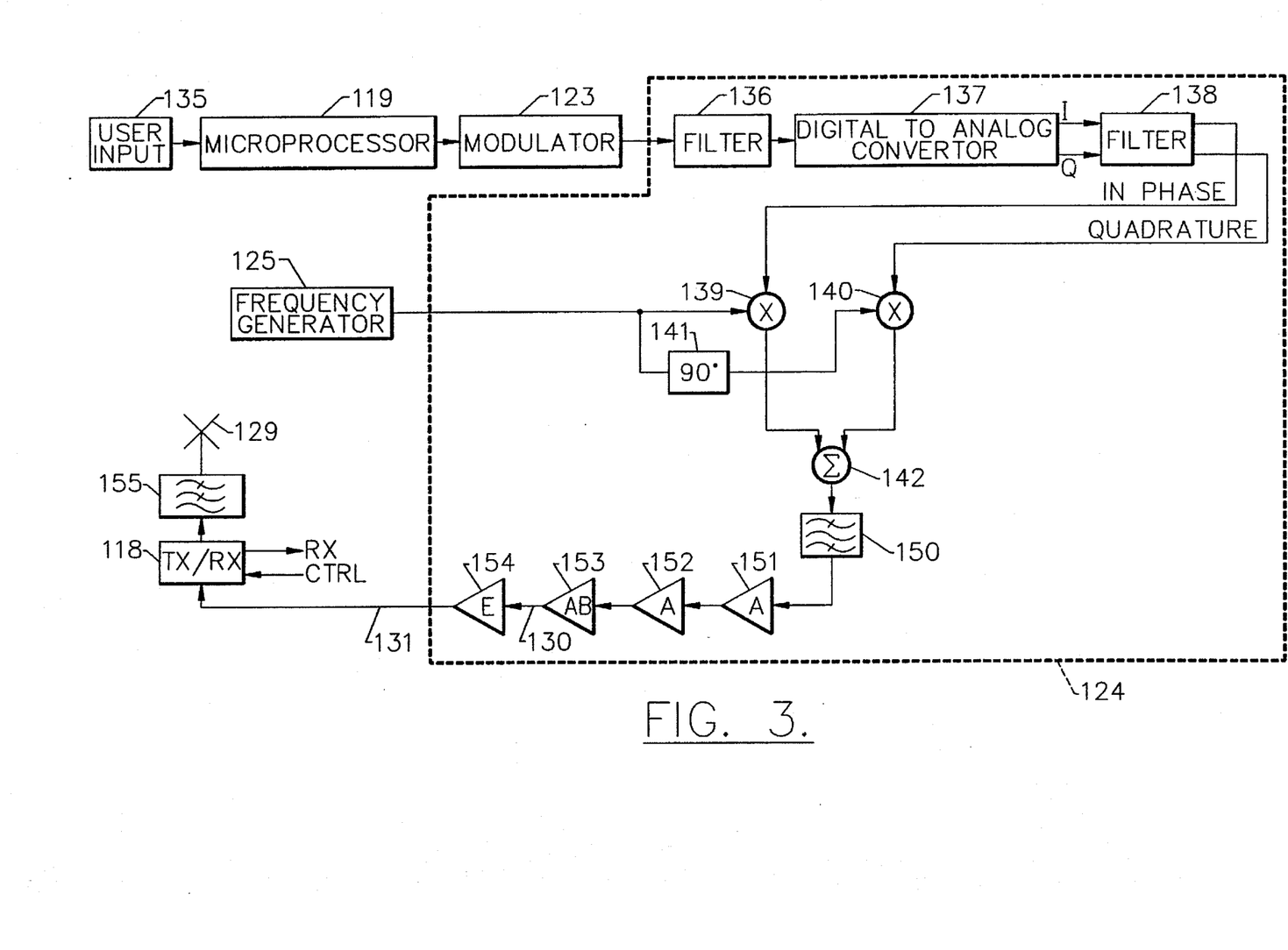
FIG. 3 is a block diagram of portions of the terminal illustrated in FIG. 2.

Referring now to FIG. 3, a preferred embodiment of the transmitter 124 of the portable terminal 110' is more fully illustrated. The microprocessor 119 may provide a data signal to be transmitted, or it may supervise a message from a user input device 135, such as an alphanumeric keypad. As known to those with skill in the art, a data message may also be provided by an RS-232 port or other well known user inputs. After modulation by the modulator 123, a modulated data signal is passed to the transmitter 124. The modulated data signal is preferably filtered by a first filter 136, which may be a digital signal processor, and then passed onto a digital to analog convertor 137. The digital to analog converter 137 supplies two analog orthogonal components of the signal, namely, the in-phase and quadrature components. The orthogonal components are then provided to a second filter 138, which is preferably a root raised cosine filter, also known as a Nyquist filter. As well known to those with skill in the art, an RF signal is produced by applying the in-phase and quadrature components of the analog signal to first and second mixers 139, 140, the outputs of which are applied to a power combiner 142. The mixers 139, 140 receive the transmission frequency from the frequency generator 125 90° out of phase from one another due to a phase shifter 141. The methods and circuitry for providing an RF output are well known to those having skill in the art and will thus not be discussed further herein.

The RF output may then be passed through a third filter 150, which is preferably a bandpass filter, prior to the amplifier stages. Depending on a number of factors, including the RF signal size from the combiner 142, the intended output power, etc., a cascade of amplifier stages 151, 152, 153, 154 are used to boost the RF signal to its transmission level. For example, four amplifier stages, as shown, might be used for a 10 watt output power. The first three amplifier stages may include two class A amplifier stages 151, 152, and a class AB amplifier stage 153. Class A amplifier stages 151, 152 are preferred as the first and second stages because they can readily amplify small signals. Class A amplifiers, however, have low overall efficiency because they are on during the full period of operation and voltage and current both exist across their collector-emitter junctions. Even though their efficiency of operation may be poor overall, they do not dissipate excessive amounts of power because they are amplifying a small signal relative to the other stages. Similarly, a class AB amplifier 153 provides better efficiency than a class A amplifier, but it too is not amplifying the largest signal. It is the last stage which boosts the RF signal to its transmission level*that tends to dissipate the most power, and thus, it is the last stage whose efficiency greatly effects the power consumption of a portable terminal 110'.

The invention uses a phase linear high efficiency class E amplifier 154 as the last stage. Accordingly, the input 130 of the class E amplifier 154 is connected to the output of the class AB amplifier 153, and the output 131 of the class E amplifier 154 is connected to the RF switch 118. The output signal is then passed through a fourth filter 155, which is preferably a lowpass filter, prior to being broadcast from the antenna 129.

Figure 4:
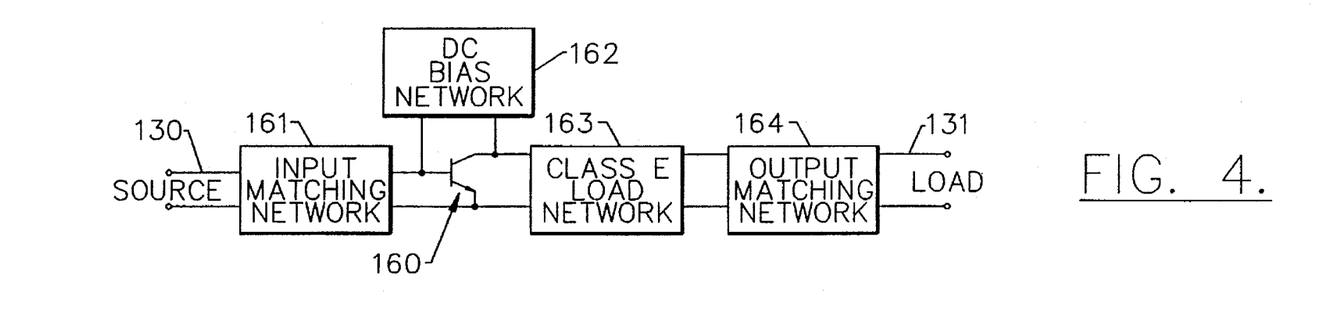
FIG. 4 is a block diagram of a class E amplifier according to the invention for use in the terminal illustrated in FIG. 2.

As illustrated in FIG. 4, the class E amplifier includes a switching transistor 160, an input matching network 161, a DC bias network 162, a class E load network 163, and an output matching network 164. Preferably, the switching transistor 160 operates at a predetermined switching frequency between about 148 and 150 MHz. The DC bias network 162 provides DC power to the switching transistor 160 and preferably includes a battery 127. In addition to providing a DC bias to the switching transistor 160, the DC bias network 162 also isolates the class E load network 163 from adverse DC effects. The input matching network 161 electrically connects the data modulated carrier signal to the switching transistor 160. The class E load network 163 loads the switching transistor 160 for phase linear class E operation, preferably over a bandwidth of between about 148 to 150 MHz. Applicant has found that phase linear amplifiers do not cause spectral regrowth problems associated with other amplifiers. In particular, Applicant has determined that the class E amplifier is a highly phase linear amplifier, and is thus an ideal candidate for phase modulated systems, such as SDPSK modulation. As used herein, phase linearity according to the invention is a phase deviation of less than about twenty degrees from the instantaneous minimum output power to the instantaneous maximum output power. The output matching network 164 electrically connects the class E load network 163 and the antenna 129.

A class E switching amplifier according to the invention has a very fast switching time. In the preferred embodiment, however, only one of the two switching times, the turn off time, is particularly significant. The turn off switching time is dominated by the storage time ($Tau_s$), that is, the time ($Tau_s$) needed to make the space charge region of a transistor neutral. The storage time should be short so that minimal and preferably no current flows through the transistor when the next state (off) begins. Preferably, a suitable turn off time for the invention, is approximately 10% of $1/f_0$, where $f_0$ is the frequency of operation. Thus, for 150 MHz, the storage time ($Tau_s$) is approximately 700 ps.

Conventional FET's do not suffer from the storage time effects typical of other transistors because they are majority carrier devices. Their output capacitances, however, are higher than bipolar transistors, which lowers efficiency. In addition, the on-state (saturation) resistance for a conventional FET is higher than that of a similar bipolar transistor, which also lowers efficiency. Accordingly, a bipolar transistor is preferred for the present invention.

Typically the storage time ($Tau_s$) of a device is not specified on data sheets describing the device. The storage time ($Tau_s$) of a device is, however, a function of $f_T$, the common emitter unity current gain bandwidth of the transistor, which is typically specified on device data sheets. A suitable transistor has a high $f_T$ with respect to its frequency of operation in the preferred embodiment. Preferably, the $f_T$ should be at least about 15 times the frequency of operation for a particular frequency of operation. Thus, for a frequency of operation of 150 MHz, the $f_T$ should be at least about 2.25 GHz or higher. The $f_T$ of the invention is based on an on-state current of 2000 mA RMS, however, the $f_T$ of a device will vary with the peak value of the on-state current. Hence, variation in on-state current will vary a suitable $f_T$.

According to another aspect of the invention, a transistor which is designed to operate at a first predetermined frequency and at a first predetermined voltage may be used; however, the transistor is preferably operated below these designed predetermined levels. A power supply 127, such as a battery, may be used for supplying a second predetermined voltage to the transistor which is less than the first predetermined voltage. In addition, the class E load network 163 preferably loads the transistor for phase linear class E operation at a second predetermined frequency which is less than the first predetermined frequency.

A presently preferred transistor is the MOTOROLA MRF 873 (without internal matching) which is a cellular transistor designed to operate at first predetermined frequencies between about 806 to 960 MHz with a 12.5 V supply. In the invention's low power application, the transistor may have a supply voltage of 4–8 V with the class E load network 163 loading the transistor's operation to second predetermined frequencies of between about 148 and 150 MHz. In other words, a second predetermined frequency is about 15% of the first predetermined frequency. The $f_T$ of the MRF 873 is about 2.5 GHz (@2000 mA RMS), which is above the $f_T$ theoretical minimum of 2.25 GHz discussed above.

The $f_T$ of other suitable transistors may be compared to their intended frequencies of operation. A suitable $f_T$ is typically found in transistors whose frequencies of operation are above about 750 MHz. Thus, transistors designed for use within cellular devices, with a frequency range in the U.S. of 800–900 MHz (European Standard 890–960 MHz), are candidates for potential substitution with the MRF 873. Another series of potential candidates for substitution, because of their fast switching times, are laterally diffused MOSFETs (LDMOSFETs).

Figure 5:
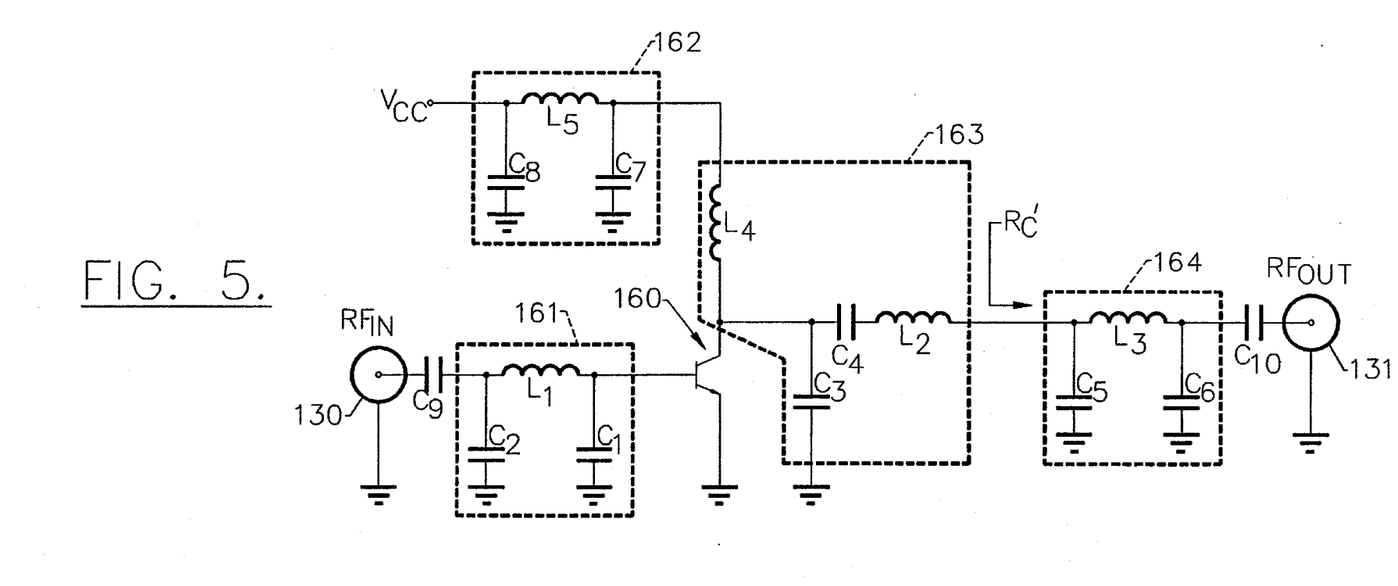
FIG. 5 is a circuit diagram of the class E amplifier illustrated in FIG. 4.

A preferred embodiment of a class E switching amplifier according to the invention is illustrated in FIG. 5. A bipolar transistor 160 is connected in a common emitter arrangement with its emitter electrically connected to a reference voltage (i.e. ground). The input impedance matching network 161, which electrically connects an RF input 130 to the switching transistor 160 is preferably comprised of two capacitors $C_1$, $C_2$ and one inductor $L_1$. The first capacitor $C_1$ is electrically connected across the bipolar transistor's base and the reference voltage. The first inductor $L_1$ is also electrically connected to the base, with the second capacitor $C_2$ electrically connected across the first inductor $L_1$ and the reference voltage.

The class E load network 163, which loads the transistor 160 for phase linear class E operation, may use two capacitors $C_3$, $C_4$ and two inductors $L_2$, $L_4$. The third and fourth capacitors $C_3$, $C_4$ are electrically connected to the collector, with the third capacitor $C_3$ being electrically connected across the collector and the reference voltage. The second inductor $L_2$ is electrically connected to the fourth capacitor $C_4$. The fourth inductor $L_4$ is electrically connected to the collector of the transistor 160. In addition, the load network 163 should take into account $C_{cbo}$; where $C_{cbo}$ is the linearized output capacitance of the switching transistor 160. If Vcc=6.8 V, the output power $P_o$=10 W, and the voltage across the collector-emitter junction of the transistor 160 (Vce) at saturation equals zero, then:

$$R_c' \approx 0.5768 \frac{V_{cc}^2}{P_o} = 2.7 \, \Omega$$

where $R_c'$ is the effective load resistance of the output impedance matching network.

If the frequency of operation, $f_o$, is 150 MHz, and it is assumed that $C_5$=0 pF, and $Q_L$=10 for sufficient harmonic rejection, then:

$$L_2 \approx \frac{Q_L R_c'}{2\pi f_0} = 29 \text{ nH};$$

$$C_4 \approx \frac{1}{2\pi f_0 Q_L R_c'} \left[ 1 + \frac{1.110}{Q_L - 1.7879} \right] = 44 \text{ pF};$$

and $$C_3 \approx \frac{0.1836}{2\pi f_0 R_c'} \left[ 1 + \frac{0.81 Q_L}{Q_L^2 + 4} \right] = 70 \text{ pF}.$$

With $C_3$ known, then:

$$L_4 \approx \frac{10}{(2\pi f_0)^2 R_c'} \cdot \frac{1}{C_3} = 53 \text{ nH}$$

Thus, the nominal values for a class E power amplifier according to the invention are:

$C_3$=70 pF, $L_2$=29 nH
$C_4$=44 pF, $L_4$=53 nH

These nominal values are a starting point for later optimization, which may include computer simulation and experimentation.

Figure 6:
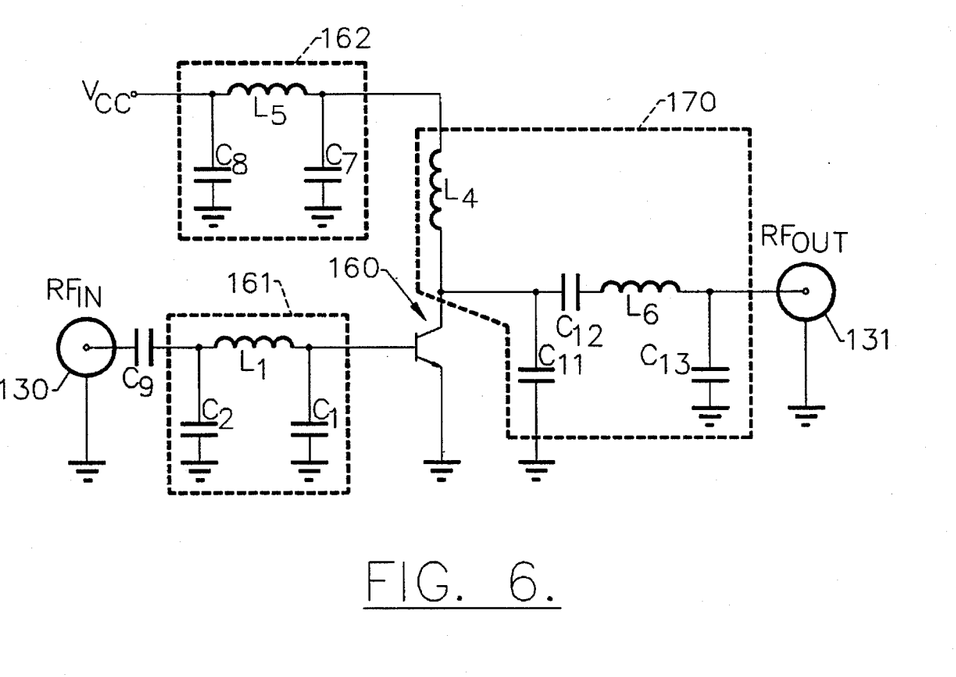
FIG. 6 is a circuit diagram of an alternative embodiment of the class E amplifier illustrated in FIG. 4.

The output impedance matching network 164, which electrically connects the RF output signal to a load, can also use two capacitors $C_5$, $C_6$ and an inductor $L_3$. The fifth capacitor $C_5$ and the third inductor $L_3$ are both electrically connected to the second inductor $L_2$, with the fifth capacitor $C_5$ electrically connected across the second inductor $L_2$ and the reference voltage. The sixth capacitor $C_6$ is electrically connected across the third inductor $L_3$ and the reference voltage. With a value for $R_c'$, then $L_3$ and $C_6$ can be determined in a well known manner using a Smith Chart; $L_3$=10 nH and $C_6$=100 pF. Those skilled in the art will recognize that elements of the output impedance matching network 164 may be combined with elements of the class E load network 163 for an overall parts reduction, yet achieving the same results, as shown in FIG. 6 at block 170. Using the first and second frequencies discussed above, one set of optimized values for $C_{11}$, $C_{12}$, $L_6$, and $C_{13}$ may be on the order of $C_{11}$=18 pF, $C_{12}$=300 pF, $L_6$=12 nH, and $C_{13}$=75 pF. Those skilled in the art would additionally recognize that specific component values for the input and output impedance matching networks 161, 164 would vary depending on the gain and output power required.

The DC bias network 162, which biases the transistor 160 with a DC voltage, may include two capacitors $C_7$, $C_8$ and one inductor $L_5$. The seventh capacitor $C_7$ and the fifth inductor $L_5$ are electrically connected to the fourth inductor $L_4$, with the seventh capacitor $C_7$ electrically connected across the fourth inductor $L_4$ and the reference voltage. The eighth capacitor $C_8$ is electrically connected across the fifth inductor $L_5$ and the reference voltage. One set of values for $C_7$, $C_8$, and $L_5$ may be on the order of $C_7$=1200 pF, $C_8$=112000 pF, and $L_5$=33 nH.

As indicated in FIG. 5, an RF input signal 130 may be applied to the transistor 160 via a DC blocking capacitor $C_9$ electrically connected to the second capacitor $C_2$ and the first inductor $L_1$. Similarly, an RF output signal may be received from another blocking capacitor $C_{10}$ which is connected to the third inductor $L_3$ and the sixth capacitor $C_6$ of the output impedance matching network 164. A second reference voltage Vcc, is preferably a DC supply voltage supplied by the battery 127 to the switching transistor 160, which may be connected to the transistor 160 via the DC bias network 162.

The advent of advanced small satellites 111 and the low-cost rockets with which they are launched has facilitated operation of the satellite communication terminal 110' of the present invention. The invention is intended to mesh with the ORBCOMM network described above, and the following design considerations are compatible with the needs of both systems.

Satellites in low-earth orbit can operate at VHF. For example, the satellite transmit frequency band can be 137–139 MHz, while the terminal transmission band can be 148–150 MHz. When using symmetric differential phase shift keying, and by setting the outbound data rate at 4800 bps and the inbound rate at 2400 bps, narrow band VHF channels can be used. The data stream can thus be transmitted to the satellite 111 on a 5 KHz wide channel in the 148–150 MHz band. Narrow band VHF also lowers costs, since it not only reduces the mass and cost of the satellites but also reduces the expense of the portable terminals 110'. The cost of a portable terminal 110' is presently contemplated to be less than $400. The present invention is thus less expensive than geostationary satellite systems and low earth orbiting voice services. The invention is also comparable with tower-based data services, but does not present the geographic limitation of any terrestrial network.

In the satellite 111, messages can be separated and transmitted downwards on one of a number of 10 KHz wide channels in the 137–139 MHz band. Each satellite may additionally transmit time signals and other data on a single designated UHF channel at, for example, 400.1 MHz. The satellites 111 would typically be in a circular orbit at an altitude of approximately 480 miles above the earth. Thus, the half-beamwidth would be close to 60 degrees, and the footprint about 2875 miles in diameter. The antenna pattern of the satellite 111 would be designed to produce increased gain away from the boresight in order to compensate for longer path lengths to portable terminals 110' near the edge of the footprint.

A constellation of low earth orbiting satellites 111 yields a footprint pattern that continually changes, with the non-covered zones moving constantly as well. Preferably, satellites 111 do not have large memories and thus would not operate in a full store and forward mode. Thus, the availability of a satellite link would require that one of the satellites 111 has simultaneous sight of the portable terminal 110' and either the network control center 112 or a relay station (not shown). In any event, it is contemplated that most regions would have availability times well in excess of ninety-five percent.

By way of example, an availability at a certain remote terminal location of ninety-eight percent would mean that, on average, there would be a communications outage at that location for two percent of the time, or for twenty-nine minutes in each 24 hour period. This does not mean, however, that there would be a single outage every day lasting nearly a half-hour. On the contrary, the outages would be frequent, short, and fairly uniformly distributed in time. It is estimated that with a ninety-five percent contour, ninety percent of the outages would last for less than two minutes. The global communications terminal 110' according to the present invention is not hampered by outages of this type. Instead, these outages permit a low cost and effective world-wide satellite communication terminal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A terminal for communicating with a low earth orbiting satellite comprising:

data signal generation means for generating a data signal for transmission to a low earth orbiting satellite;

modulation means, having an input and an output, said input being electrically connected to said data signal generation means for converting the data signal into a phase modulated data signal;

a class E switching amplifier, having an input and an output, said input of said class E switching amplifier being electrically connected to said output of said modulation means, said class E switching amplifier amplifying the phase modulated data signal into a phase modulated signal at frequencies between 148 and 150 MHz; and an antenna, electrically connected to said output of said class E switching amplifier, for transmitting the phase modulated signals at frequencies between 148 and 150 MHz to the low earth orbiting satellite.

2. A terminal according to claim 1 wherein said modulation means converts said data signal into a phase shift keyed data signal and wherein said class E switching amplifier is a phase linear class E switching amplifier over a bandwidth between 148 and 150 MHz.

3. A terminal according to claim 2 wherein said modulation means converts said data signal into a symmetric differential phase shift keyed data signal.

4. A terminal according to claim 1 wherein said data signal generation means comprises user input means, responsive to user activation, for accepting input of a user message.

5. A terminal according to claim 1 further comprising a battery power supply, electrically connected to both said data signal generation means and said class E switching amplifier, to thereby produce a portable terminal.

6. A terminal according to claim 1 in combination with a low earth orbiting satellite which receives the phase modulated signals at frequencies between 148 and 150 MHz.

7. A terminal according to claim 1 wherein said class E switching amplifier comprises:

a switching transistor operating at a predetermined switching frequency between 148 and 150 MHz;

DC power supply means for supplying DC power to said switching transistor;

an input matching network, which electrically connects said data signal generation means to said switching transistor;

a class E load network, electrically connected to said switching transistor, which loads said switching transistor for class E operation; and an output matching network, electrically connected between said class E load network and said antenna.

8. A terminal according to claim 7 wherein said class E load network is a phase linear load matching network which loads said switching transistor for phase linear class E operation over a bandwidth of between 148 to 150 MHz.

9. A class E switching amplifier for amplifying an input signal and driving a load over a predetermined bandwidth, said class E switching amplifier comprising:

a transistor which is designed to operate at a first predetermined frequency which is greater than 800 MHz and at a first predetermined voltage;

power supply means for supplying a second predetermined voltage to said transistor, said second predetermined voltage being less than said first predetermined voltage;

an input matching network, electrically connecting the input signal to said transistor;

a class E load network, electrically connected to said transistor, which loads said transistor for phase linear class E operation at a second predetermined frequency which is between 148 to 150 MHz; and an output matching network, electrically connected between said class E load network and the load.

10. A class E switching amplifier according to claim 9 wherein said second predetermined frequency is 15% of said first predetermined frequency.

11. A class E switching amplifier according to claim 9 wherein said first predetermined voltage is 12.5 V and wherein said second predetermined voltage is between 4 to 8 V.

12. A class E switching amplifier according to claim 11 wherein said transistor is a cellular transistor designed to operate at first predetermined frequencies between 806 to 960 MHz and wherein said class E load network loads said transistor to operate at second predetermined frequencies of between 148 to 150 MHz.

13. A class E switching amplifier according to claim 9 and further comprising an input signal, electrically connected to said input matching network, said input signal being a phase shift keyed input signal and said class E switching amplifier being a phase linear class E switching amplifier at second predetermined frequencies between 148 to 150 MHz.

14. A class E switching amplifier according to claim 13 wherein said input signal is a symmetric differential phase shift keyed input signal.

\* \* \* \* \*